US006613496B1

(12) United States Patent
Inno et al.

(10) Patent No.: US 6,613,496 B1
(45) **Date of Patent: *Sep. 2, 2003**

(54) METHOD FOR FORMING A DAMPENING-WATERLESS LITHOGRAPHIC PLATE AND METHOD FOR FORMING AN IMAGE USING A DAMPENING-WATERLESS LITHOGRAPHIC PLATE

(75) Inventors: Toshifumi Inno, Shizuoka-ken (JP); Hiroaki Yokoya, Shizuoka-ken (JP); Masahiko Fukaya, Shizuoka-ken (JP)

(73) Assignee: Fuji Photo Film Co., Ltd., Minami-Ashigara (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/942,199

(22) Filed: Oct. 1, 1997

(30) Foreign Application Priority Data

Oct. 2, 1996 (JP) ........................................ 8-261878

(51) Int. Cl.[7] ........................................ G03F 7/26

(52) U.S. Cl. ....................... 430/303; 430/325; 430/348; 430/401; 430/272.1; 430/273.1; 430/945

(58) Field of Search ................................ 430/303, 302, 430/272.1, 273.1, 945, 325, 326, 348, 401

(56) References Cited

U.S. PATENT DOCUMENTS

| | | | | | |
|---|---|---|---|---|---|
| 5,888,696 | A | * | 3/1999 | Hirano et al. | 430/272.1 |
| 5,919,600 | A | * | 7/1999 | Huang et al. | 430/272.1 |
| 5,968,709 | A | * | 10/1999 | Verschueren et al. | 430/272.1 |
| 6,138,567 | A | * | 10/2000 | Ray et al. | 101/463.1 |
| 6,228,559 | B1 | * | 5/2001 | Oda | 430/272.1 |
| 6,344,306 | B1 | * | 2/2002 | Fujuyoshi et al. | 430/272.1 |
| 2001/0026902 | A1 | * | 10/2001 | Hirano et al. | 430/272.1 |
| 2002/0045131 | A1 | * | 4/2002 | Nagase et al. | 430/292 |
| 2002/0068239 | A1 | * | 6/2002 | Van Damme et al. | 430/273.1 |
| 2002/0081529 | A1 | * | 6/2002 | Sonokawa | 430/303 |

FOREIGN PATENT DOCUMENTS

| | | | | |
|---|---|---|---|---|
| EP | 573091 | | 12/1993 | |
| EP | 649757 | * | 4/1995 | |
| WO | WO 99/11467 | * | 3/1999 | B41N/1/00 |

* cited by examiner

*Primary Examiner*—Rosemary Ashton
*Assistant Examiner*—Barbara Gilliam
(74) *Attorney, Agent, or Firm*—Burns, Doane, Swecker & Mathis, LLP

(57) ABSTRACT

A method for forming a dampening-waterless lithographic plate comprising an irradiation step of irradiating a dampening-waterless lithographic blank plate imagewise with a laser beam, the blank plate comprising a support, a photothermal conversion layer provided on the support for converting laser beam energy to heat, and an ink-repellent layer provided on the photothermal conversion layer a first rubbing step of rubbing the surface of the ink-repellent layer without use of a liquid so as to remove at least a portion of the ink-repellent layer in areas irradiated with a laser beam and a second rubbing step of rubbing the surface of the partially removed ink-repellent layer through use of a liquid.

12 Claims, No Drawings

METHOD FOR FORMING A DAMPENING-WATERLESS LITHOGRAPHIC PLATE AND METHOD FOR FORMING AN IMAGE USING A DAMPENING-WATERLESS LITHOGRAPHIC PLATE

BACKGROUND OF THE INVENTION

1. Field of the Invention

The present invention relates to a method for forming a dampening-waterless lithographic plate capable of performing printing without use of dampening water, through employment of heat mode recording achieved by means of a laser beam.

2. Description of the Related Art

As conventional printing methods, there are known typographic printing, gravure printing, lithographic offset printing, and the like. In recent years, lithographic offset printing has become popular except for special fields. There are known two types of lithographic offset printing: one is wet printing in which an image pattern composed of hydrophilic areas and oleophilic areas is formed at a plate surface and dampening water is used for printing, and the other is waterless printing in which an image pattern composed of ink-repellent areas and ink-receptive areas is formed at a plate surface and no dampening water is used for printing. The waterless printing has advantages compared to the wet printing, in that skill in printing work is not required since dampening water is not used, and that ink density is constant from the incipient stage of printing and an amount of spoilage is small, which realizes economical printing when the number of copies is relatively small.

Advancement of computer technology has digitized a plate-making process, which is a preparatory process for printing and which had previously been carried out manually, and has enabled recording of print images in the form of digital data. In recent years, a technique for directly forming a plate from this digital data without use of lith-type film (computer-to-plate technique) has been developed. However, in many cases, such techniques are intended to form wet plates, and techniques for forming waterless plates are rarely known.

Japanese Patent Application Publication (JP-B) No. 42-21879 provides the earliest disclosure of a technique for forming a waterless plate through use of laser for writing. According to the publication, an ink-repellent silicone layer which is an outermost layer of a plate is removed imagewise through irradiation with a laser beam, thereby forming imagewise ink-receptive areas and thus forming a plate for a waterless printing. However, this technique has involved problems in that silicone removed by irradiation with a laser beam scatters over the entire plate, causing problems during printing, and in that a portion of the silicone layer, which portion has been irradiated with a laser beam but has not been completely remove, peels off as printing continues, resulting in an increase in the size of ink-receptive areas (dot gain).

Japanese Patent Application Laid-Open (JP-A) No. 50-158405 discloses a method for forming a waterless plate in which a dampening-waterless lithographic blank plate (hereinafter referred to as waterless blank plate) having a silicone rubber surface layer is irradiated with a YAG laser beam (an infrared laser beam) and subsequently a portion, irradiated with a laser beam, of the silicone layer is removed through solvent (naphtha) processing to thereby form a waterless plate.

Further, European Patent No. 573,091 discloses a method for forming a waterless plate in which a plate having a silicone rubber surface layer is irradiated with a YAG laser beam, and subsequently the silicone rubber surface layer is partially rubbed off under dry conditions in which no solvent is used or is partially rubbed off using a solvent which does not swell the silicone rubber, to thereby form a waterless plate.

However, in these methods, silicone rubber in non-image areas may be scratched by rubbing during the removal of silicone rubber from areas exposed to a laser beam. Also, it is difficult to completely remove, from the plate surface, silicone rubber which has been removed from exposed areas. Accordingly, when printing is carried out by use of the waterless plates formed by these methods, drawbacks such as dropout in the image areas, tinting due to the scratching of the non-image areas, and the like arise.

As described above, the methods for forming a waterless plate through the use of a laser have failed to achieve both complete removal of a silicone layer from exposed areas (developing performance) and excellent printing performance.

SUMMARY OF THE INVENTION

An object of the present invention is to provide a method for forming a waterless plate which enables laser recording and provides satisfactory removal of an ink-repellent layer from exposed areas, as well as satisfactory printing performance.

Another object of the present invention is to provide a method for forming a waterless plate, which method does not involve the formation of scratches in non-image areas and thereby prevents tinting in non-image areas during printing, and which method also does not involve the re-adhesion of removed pieces of the ink-repellent layer to the plate surface and thereby prevents dropout in image areas.

The inventors of the present invention carried out extensive studies on a method for forming a waterless plate which can be written with a laser, and as a result, found that the above objects were achieved by a method for forming a dampening-waterless lithographic plate, comprising an irradiation step of irradiating a dampening-waterless lithographic blank plate imagewise with a laser beam, the blank plate comprising a support, a photothermal conversion layer provided on the support for converting laser beam energy to heat, and an ink-repellent layer provided on the photothermal conversion layer, a first rubbing step of rubbing the surface of the ink-repellent layer without use of a liquid so as to remove at least a portion of the ink-repellent layer in areas irradiated with a laser beam and a second rubbing step of rubbing the surface of the partially removed ink-repellent layer through use of a liquid.

As used herein, a dampening-waterless lithographic blank plate (or a waterless blank plate) means a plate in which an image pattern composed of ink-receptive areas and ink-nonreceptive areas is not formed, while a dampening-waterless lithographic plate (or a waterless plate) means a plate in which an image pattern is formed and which can be used for printing.

DETAILED DESCRIPTION OF THE PREFERRED EMBODIMENTS

Embodiments of the present invention will now be described.

Method for Forming a Waterless Plate:

A waterless blank plate used in the present invention includes a support, a photothermal conversion layer provided on the support for converting laser beam energy to heat, and an ink-repellent layer provided on the photothermal conversion layer.

When the waterless blank plate is irradiated with a laser beam which the photothermal conversion layer can absorb, the photothermal conversion layer absorbs the laser beam energy and sharply increases in temperature and thus undergoes, partially or entirely, a chemical reaction or a physical change, such as combustion, fusion, decomposition, vaporization, or ablation. As a result, adhesion between the support and the ink-repellent layer decreases, so that the ink-repellent layer peels off easily from the support. Since such decrease in adhesion occurs only in the areas irradiated with a laser beam, the ink-repellent layer can be selectively removed.

The laser used in the present invention for exposing a waterless blank plate is not particularly limited so long as it can provide an exposure amount such that the adhesion between an exposed portion of the ink-repellent layer and the support is reduced and the exposed portion of the ink-repellent layer and the support is reduced and the exposed portion can be peeled off from the support, without the exposed portion of the ink-repellent layer being scattered and the unexposed portion of the ink-repellent layer being damaged. Such lasers include gas lasers such as an Ar laser and a carbon dioxide laser, solid lasers such as a YAG laser, and semiconductor lasers. Usually, the present invention requires a laser having an output power of 100 mW or higher. From practical aspects such as maintenance and price, semiconductor lasers and semiconductor-excited solid lasers (YAG laser, etc.) are preferably used.

Wavelengths of the laser output used for recording fall in the infrared wavelength region, specifically from 800 nm to 1100 nm in many cases.

A waterless blank plate is irradiated with a laser beam preferably from the ink-repellent layer side, but may be irradiated with a laser beam from the support side when the support is transparent.

Also, the imaging apparatus described in JP-A No. 6-186750 may be used for exposure of a waterless blank plate.

The waterless plate of the present invention is obtained by reducing adhesion between a support and an ink-repellent layer in areas exposed to a laser beam, and selectively peeling off the ink-repellent layer from the exposed areas so as to expose the support as the ink-receptive layer. In the present invention, the ink-repellent layer is removed from areas exposed to a laser beam through a first rubbing step, where the ink-repellent layer is rubbed without use of a liquid, and through a second rubbing step, where the ink-repellent layer is rubbed through use of a liquid.

When the surface of the ink-repellent layer is rubbed in order to remove the ink-repellent layer from areas exposed to a laser beam, the ink-repellent layer cracks first, and then peeling off begins from the cracks. When a liquid is used in this rubbing, a rubbing member such as a brush slips on the ink-repellent layer surface and is thus less likely to catch the surface, so that it is difficult for the ink-repellent layer to be peeled off. Accordingly, in order to obtain required achievement of rubbing, the ink-repellent layer surface should be rubbed strongly or repeatedly.

On the other hand, in dry rubbing where the ink-repellent layer surface is rubbed without use of a liquid, the rubbing member catches the ink-repellent layer surface well, so that the ink-repellent layer easily peels off. Therefore, the ink-repellent layer surface may be rubbed under moderate conditions. However, due to lack of a liquid, ink-repellent layer pieces removed from the exposed areas are likely to adhere to unexposed non-image areas and image areas which have been formed through removal of the ink-repellent layer.

In the first rubbing step of the present invention, the ink-repellent layer surface is rubbed by a development pad and/or a brush without use of a liquid, so that most of the ink-repellent layer is removed efficiently from areas exposed to a laser beam.

However, in the first rubbing step, the ink-repellent layer pieces removed from the exposed areas adhere to non-image areas and/or image areas which have been formed through removal of the ink-repellent layer, and it is difficult to completely remove these adhering flakes from the plate surface. Also, when the first rubbing step is carried out to such an extent as not to damage the ink-repellent layer in non-image areas, a portion of the ink-repellent layer in the areas exposed to a laser beam may remain.

Thus, subsequently to the first rubbing step, the second rubbing step for rubbing the ink-repellent layer surface while using a liquid is carried out to thereby completely remove adhering pieces of the ink-repellent layer from the plate surface and the remainder of the ink-repellent layer from areas exposed to a laser beam. The second rubbing step can be performed by a known method, for example, by rubbing the plate surface with a liquid-containing development pad or by rubbing the plate surface with a brush after a liquid is poured onto the plate surface. The temperature of a liquid used for the rubbing is not particularly limited, but is preferably 10° C. to 50° C.

In the present invention, a known developer for use with a waterless plate may be used as a liquid for use in the second rubbing step. Examples of such a developer include hydrocarbons, polar solvents, water, and combinations thereof. In view of safety, water or an aqueous solution of a water-soluble solvent which solution contains water as its principal component is preferred. In consideration of safety and inflammability, the concentration of a water-soluble solvent is preferably less than 40% by weight.

Hydrocarbons usable as the above developer include aliphatic hydrocarbons (for example, hexane, heptane, gasoline, kerosene, and commercial solvents "Isopar E, Isopar H, and Isopar G" manufactured by Esso Kagaku K.K.), aromatic hydrocarbons (for example, toluene and xylene), and halogenated hydrocarbons (Trichlene, etc.). Examples of polar solvents include alcohols (for example, methanol, ethanol, propanol, isopropanol, benzyl alcohol, ethylene glycol monomethyl ether, 2-ethoxyethanol, tripropylene glycol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol, and tetraethylene glycol); ketones (such as acetone and methyl ethyl ketone); esters (such as ethyl acetate, methyl lactate, butyl lactate, propylene glycol monomethyl ether acetate, diethylene glycol acetate, and diethyl phthalate); triethyl phosphate; and tricresyl phosphate. Water may be tap water, pure water, distilled water, or the like. These may be used singly or in combinations of two or more.

When a hydrocarbons having low affinity to water or a polar solvent having low affinity to water is used in the second rubbing process, a surfactant or the like may be used therewith in order to improve the solubility to water. An alkali (for example, sodium carbonate, diethanolamine, and sodium hydroxide) may also be added together with a surfactant.

As described above, through execution of the first rubbing step for rubbing the ink-repellent layer surface without use of a liquid after irradiation with a laser beam and subsequent execution of the second rubbing step for rubbing the ink-repellent layer surface through use of a liquid, the ink-repellent layer can be reliably removed from the areas exposed to the laser beam; in other words, adhering pieces of the ink-repellent layer which result in a deterioration in printing performance can be reliably removed from the plate surface.

Waterless Blank Plate:

A waterless blank plate used in the present invention is manufactured in the following manner.

As a support used in the present invention, there may be used a known support which is normally used in offset printing. Examples of such a known support include metallic supports, plastic films, paper sheets, and combinations thereof. These supports must meet requirements for physical properties such as mechanical strength and elongation resistance under printing conditions to be employed. Specific supports include metallic supports formed of aluminum or the like; plastic supports formed of polyethylene terephthalate, polyethylene naphthalate, polycarbonate, or the like; paper sheets; and composite sheets composed of paper and a plastic laminated film which is formed of polyethylene, polypropylene, or the like.

The thickness of the support is 25 $\mu$m to 3 mm, preferably 75 $\mu$m to 500 $\mu$m. However, the optimum thickness of a support depends on the kind of support and printing conditions employed. Generally, a thickness of 100 $\mu$m to 300 $\mu$m is most preferable.

In order to improve adhesion of the support to an adjacent layer or printing characteristics or to attain high sensitivity, these supports may be surface-treated through corona processing or the like or a primer layer may be provided on the support.

Examples of a primer layer which can be used in the present invention include a primer layer obtained by exposing various photosensitive polymers to harden them before a photothermal conversion layer is formed thereon, as disclosed in JP-A No. 60-22903; a primer layer obtained by hardening an epoxy resin through heating, as disclosed in JP-A No. 62-50760; a primer layer obtained by hardening gelatin, as disclosed in JP-A No. 63-133151; a primer layer composed of a urethane resin and a silane coupling agent, as described in JP-A No. 3-200965; and a primer layer composed of the urethane resin disclosed in JP-A No. 3-273248. In addition, a hardened film of gelatin or casein also effectively serves as a primer layer. Further, these primer layers may contain other polymer such as polyurethane, polyamide, styrene, butadiene rubber, carboxy-modified styrene/butadiene rubber, acrylonitrile/butadiene rubber, carboxy-modified acrylonitrile/butadiene rubber, polyisoprene, acrylate rubber, polyethylene, chlorinated polyethylene, chlorinated polypropylene, vinyl chloride/vinyl acetate copolymer, nitrocellulose, halogenated polyhydroxystyrene, rubber chloride, or the like. The amount of these compounds is not particularly limited. A primer layer may be formed of an additive only so long as a film layer can be formed. Also, a primer layer may contain, as additives, a bonding aid (e.g. a polymerizable monomer, a diazo resin, a silane coupling agent, a titanate coupling agent, or an aluminum coupling agent) and a dye. The primer layer, after being formed, may be hardened through exposure.

A primer layer is also useful as an ink-receptive layer, particularly useful when a support, like a metallic support, is not receptive to ink. Also, the primer layer serves as a cushion layer for relaxing a pressure imposed on a layer having an ink-repellent surface during printing.

Generally, the amount of the primer layer in a dried state is 0.05 $g/m^2$ to 10 $g/m^2$, preferably 0.1 $g/m^2$ to 8 $g/m^2$, more preferably 0.2 $g/m^2$ to 5 $g/m^2$.

A photothermal conversion layer in the present invention converts the energy of a laser beam used for writing to heat (photothermal conversion). A known photothermal conversion layer having this converting function may be used in the present invention.

As a photothermal conversion agent used in this photothermal conversion layer, there have been known various organic and inorganic materials, such as organic dyes, organic pigments, metals, and metal oxides, having a photo-absorbing region corresponding to the wavelength of a laser beam used for writing. Examples of an organic dye applicable to the case where a light source is an infrared laser include various compounds described in “Infrared Sensitizing Dyes” (by MATUOKA, Plenum Press, New York, N.Y. (1990)), U.S. Pat. No. 4,833,124, European Patent No. 321,923, U.S. Pat. Nos. 4,772,583, 4,942,141, 4,948,776, 4,948,777, 4,948,778, 4,950,639, 4,912,083, 4,952,552, and 5,023,229. Examples of an organic pigment applicable to the case where a light source is an infrared laser include acid carbon black, basic carbon black, neutral carbon black, various carbon blacks which are surface-modified or surface-coated for improvement of dispersibility, and nigrosines. Examples of metal applicable to the case where a light source is an infrared laser include aluminum, titanium, tellurium, chromium, tin, indium, bismuth, zinc, lead, and alloys thereof. Examples of a metal oxide applicable to the case where a light source is an infrared laser include indium-tin oxide, tungsten oxide, manganese oxide, and titanium oxide. In addition, also usable are carbides, nitrides, borides, and fluorides of the aforementioned metals; and conductive polymers such as polypyrrole and polyaniline. These materials are used in the form of a homogeneous film or a heterogeneous film which contains other components such as binders, additives, and the like.

For formation of the photothermal conversion layer in the form of a homogeneous film, a film which contains at least one of metals (such as aluminum, titanium, tellurium, chromium, tin, indium, bismuth, zinc, and lead), alloys of these metals, metal oxides, metal carbides, metal nitrides, metal borides, metal fluorides, and organic dyes can be formed on a support by vapor deposition or sputtering.

For formation of the photothermal conversion layer in the form of a heterogeneous film, a photothermal conversion agent is dissolved or dispersed in a binder and mixed with other components, and subsequently the resulting mixture is applied onto a support. For this purpose, a known binder capable of dissolving or dispersing the photothermal conversion agent is used. Examples of such a known binder include cellulose, cellulose derivatives such as nitrocellulose, and ethyl cellulose; homopolymers and copolymers of acrylic acid esters; homopolymers and copolymers of methacrylic acid esters, such as polymethyl methacrylate and polybutyl methacrylate; acrylic acid ester-methacrylic acid ester copolymers; homopolymers and copolymers of styrene monomers, such as polystyrene and $\alpha$-methylstyrene; synthetic rubbers such as polyisoprene and styrene/butadiene copolymers; homopolymers of vinyl esters such as polyvinyl acetate; vinyl ester-containing copolymers such as vinyl acetate/vinyl chloride copolymers; condensation polymers such as polyurea, polyurethane, polyester, and polycarbonate; and binders used in a so-called "chemical amplification system" described in "J. Imaging Sci., P59–64, 30 (2), (1986) (Frechet, et. al)," "Polymers in Electronics (Symposium Series), P11, 242, T. Davidson, Ed., ACS Washington, D.C. (1984) (Ito, Willson)," and "Microelectronic Engineering, P3-10, 13 (1991) (E. Reichmanis, L. F. Thompson)."

When the photothermal conversion layer is formed in the form of a heterogeneous film, various additives may be added according to intended purposes, such as the improvement of mechanical strength of the photothermal conversion layer, the improvement of laser recording sensitivity, the improvement of dispersibility of a photothermal conversion agent in the photothermal conversion layer, and the improvement of adhesion of the photothermal conversion layer to an adjacent layer such as a support or a primer layer.

For example, as additives to improve mechanical strength of the photothermal conversion layer are used various cross linking agents for cross linking the photothermal conversion layer.

Also, as additives to improve laser recording sensitivity are used known compounds which decompose through exposure to heat converted from energy of an applied laser beam and generate gas to thereby rapidly inflate the volume of the photothermal conversion layer and facilitate peeling off of a layer having an ink-repellent surface, which will be described later. Examples of these known compounds include dinitrosopentamethylenetetramine, N,N'-dimethyl-N,N'-dinitrosoterephthalamide, p-toluenesulfonyl hydrazide, 4,4-oxybis(benzenesulfonyl hydrazide), and diamidobenzene.

Further, known compounds which decompose through heating and generate acidic compounds may be used as additives. Through use of these additives together with binders for use in a chemical amplification system, the decomposition temperatures of components of the photothermal conversion layer are lowered significantly, resulting in improved laser recording sensitivity. Examples of these additives include iodonium salts, sulfonium salts, phosphonium tosylate, oxime sulfonate, dicarbodiimide sulfonate, and triazine.

When an organic pigment such as carbon black is used as a photothermal conversion agent, dispersibility of the organic pigment may exert an effect on laser recording sensitivity. Thus, in order to improve laser recording sensitivity through the improvement of dispersibility of the organic pigment, various pigment dispersants may be used as additives.

Also, known adhesion improvers, such as silane coupling agents and titanate coupling agents, may be used as additives to improve adhesion. In addition, various other additives, such as surfactants to improve application performance, may be used as needed.

The photothermal conversion layer in the form of a homogeneous film is formed by vapor deposition or sputtering. In this case, the film thickness is 50 angstroms to 1000 angstroms, preferably 100 angstroms to 800 angstroms. The photothermal conversion layer in the form of a heterogeneous film is formed through coating. In this case, the film thickness is 0.05 $\mu$m to 10 $\mu$m, preferably 0.1 $\mu$m to 5 $\mu$m. If the photothermal conversion layer is too thick, an adverse effect such as impaired laser recording sensitivity will result.

An ink-repellent layer in the present invention may be formed of a known ink-repellent material.

Fluorine or silicone compounds are known to have low surface energy and are thus conventionally used as ink-repellent materials. Particularly, a silicone rubber (a silicone elastomer) is preferably used as a material for the ink-repellent layer of a waterless blank plate.

Silicone rubbers are generally classified into three types, namely condensation silicone rubbers, addition silicone rubbers, and silicone rubbers hardened by radiation. These known silicone rubbers can be used as materials for the ink-repellent layer of a waterless blank plate in the present invention.

When a condensation silicone rubber is used as a material for the ink-repellent layer, a composition of (a) diorganopolysiloxane (100 parts by weight), (b) a condensation type cross linking agent (3 to 70 parts by weight), and (c) a catalyst (0.01 to 40 parts by weight) is preferably used.

The aforementioned component (a), diorganopolysiloxane, is a polymer having a repeating unit as represented by the following formula. Each of $R^1$ and $R^2$, which may be substituted, is an alkyl group having 1 to 10 carbon atoms, a vinyl group or an aryl group. Generally, 60% or more of the $R^1$ and $R^2$ are preferably methyl groups, vinyl halide groups, phenyl halide groups, or the like.

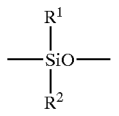

Such diorganopolysiloxane preferably has hydroxyl groups at both ends.

The aforementioned component (a) preferably has a number average molecular weight of 3,000 to 100,000, preferably 10,000 to 70,000.

The component (b) may be any cross linking agent so long as it is of the condensation type, but is preferably a cross linking agent represented by the following formula.

$R^1m.Si.Xn(m+n=4;\ n=2\text{ or greater})$ wherein $R^1$ is the same group as described above; and X represents a halogen atom such as Cl, Br, I, or the like, a hydrogen atom, a hydroxyl group, or an organic substituent as shown below.

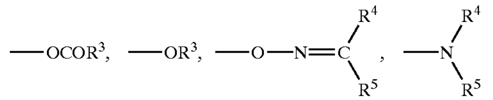

wherein $R^3$ represents an alkyl group having 1 to 10 carbon atoms or an aryl group having 6 to 20 carbon atoms; and each of $R^4$ and $R^5$ represents an alkyl group having 1 to 10 carbon atoms.

Examples of component (c) include the following known catalysts: carboxylic acid salts of metals such as tin, zinc, lead, calcium, and manganese, for example, dibutyl tin laurate, lead octylate, and lead naphthenate; and chloroplatinic acid.

When an addition-type silicone is used as a material for the ink-repellent layer, a composition of (d) diorganopolysiloxane having an addition reactive functional group (100 parts by weight), (e) organohydrogenpolysiloxane (0.1 to 25 parts by weight), and (f) addition catalyst (0.00001 to 1 part by weight) is preferably used.

The aforementioned component (d), diorganopolysiloxane having an addition reactive functional group, is organopolysiloxane which has at least two alkenyl groups (more preferably vinyl groups) linked directly to a silicon atom within one molecule. Alkenyl groups may be located at end or intermediate positions of the molecule. Component (d) may have, in addition to alkenyl groups, other organic groups which are substituted or unsubstituted alkyl groups having 1 to 10 carbon atoms and aryl group. Also, component (d) may have a slight amount of hydroxyl groups. Component (d) has a number average molecular weight of 3,000 to 100,000, preferably 10,000 to 70,000.

Examples of the component (e) include polydimethylsiloxane having hydrogen groups at both ends, α,ω-dimethylpolysiloxane, a methylsiloxane/dimethylsiloxane copolymer having methyl groups at both ends, cyclic polymethylsiloxane, polymethylsiloxane having trimethylsilyl groups at both ends, and a dimethylsiloxane/methylsiloxane copolymer having trimethylsilyl groups at both ends.

The component (f) is selected from known catalysts, particularly from platinum compounds. Examples of such platinum compounds include platinum, platinum chloride, chloroplatinic acid, and olefin-coordinated platinum.

To these compositions, cross linking inhibitors may be added for the purpose of controlling the hardening rate of silicone. Examples of such inhibitors include vinyl group-containing organopolysiloxane such as tetracyclo (methylvinyl)siloxane, alcohols which contain carbon—carbon triple bonds, acetone, methyl ethyl ketone, methanol, ethanol, and propylene glycol monomethylether.

Silicone hardened by radiation is obtained by preparing a coating solution containing a silicone base polymer which has functional groups (which are polymerized upon exposure to radiation) and an initiator, applying the coating solution onto a support, and exposing the entire coated surface to radiation. Usually, a base polymer having acrylic functional groups is used and cross-linked through irradiation with ultraviolet.

These silicone rubbers are described in detail in "R&D report No. 22—The Latest Application Technology for Silicone" (Published by CMC, 1982), JP-B No. 56-23150, JP-A No. 3-15553, and JP-B No. 5-1934.

The above-described layer having an ink-repellent surface is applied onto the photothermal conversion layer either directly or via another layer.

To the layer having an ink-repellent surface, there may be added, as needed, fine powder of an inorganic substance such as silica, calcium carbonate, titanium oxide, or the like, co-adhesive such as a silane coupling agent, a titanate coupling agent, an aluminum coupling agent, or the like, and a photopolymerization initiator.

When the layer having an ink-repellent surface is formed of a silicone rubber, a small layer thickness impairs the ink repellent performance and results in the ink-repellant surface being scratched easily; on the other hand, a large layer thickness impairs developing performance. Thus, the thickness of the dried silicone rubber layer is 0.3 μm to 10 μm, preferably 0.5 μm to 5 μm, and more preferably 1 μm to 3 μm.

In the above-described plate, various silicone rubber layers may further be formed on the layer having an ink-repellent surface.

In order to protect the surface of the ink-repellent layer, a transparent film may be laminated on the layer surface, or the layer surface may be coated with a polymer. Such a transparent film can be formed of, for example, polyethylene, polypropylene, polyvinyl chloride, polyvinylidene chloride, polyvinyl alcohol, polyethylene terephthalate, or cellophane. These films may be oriented. Also, the film surface may be subjected to a mat processing, but an unmatted film surface is preferable in the present invention.

EXAMPLES

The present invention will next be described by way of example, which should not be construed as limiting the invention.

Example 1

Support

A gelatin undercoat layer, which served as a primer layer, was formed on a polyethylene terephthalate film having a thickness of 175 μm such that the primer layer became 0.2 μm thick when dried.

Preparation of a Carbon Black Dispersion

A mixture of the following components was subjected to a dispersing process for 30 minutes through use of a paint shaker. Subsequently, glass beads were filtered off to obtain a carbon black dispersion.

<Composition of the Carbon Black Dispersion>

| | |
|---|---|
| Carbon black (#40, manufactured by Mitsubishi Chemical Corp.) | 5.0 g |
| CRISON 3006LV (polyurethane manufactured by Dainippon Ink & Chemicals, Inc.) | 4.0 g |
| Nitrocellulose (contg. 2-propanol 30%, degree of polymerization 80, manufactured by Nacalai Tesque) | 1.3 g |
| Solsperse S27000 (manufactured by ICI) | 0.4 g |
| Propylene glycol monomethylether | 45 g |
| Glass beads | 160 g |

Formation of a Photothermal Conversion Layer

The aforementioned polyethylene terephthalate film having a gelatin undercoat was coated with the following coating solution such that the coating became 2 μm thick when dried, thereby forming a photothermal conversion layer.

<Composition of a Coating Solution for the Photothermal Conversion Layer>

| | |
|---|---|
| The above carbon black dispersion | 55 g |
| Nitrocellulose (contg. 2-propanol 30%, degree of polymerization 80, manufactured by Nacalai Tesque) | 4.0 g |
| Propylene glycol monomethylether | 45 g |

Formation of a Silicone Rubber Layer

The following coating solution was applied onto the above photothermal conversion layer, followed by drying for 2 minutes at 110° C., thereby forming an addition silicone rubber layer having a dry film thickness of 2 μm. Thus, a waterless blank plate for laser recording was obtained.

<Composition of a Coating Solution for the Silicone Rubber Layer>

| | |
|---|---|
| α-ω-divinylpolydimethylsiloxane (degree of polymerization approx. 700) | 9.00 g |
| $(CH_3)_3$—Si—O—$(SiH(CH_3)$—$O)_8$—Si $(CH_3)_3$ | 0.60 g |
| Polydimethylsiloxane (degree of polymerization approx. 8000) | 0.50 g |
| Olefin/chloroplatinic acid | 0.08 g |
| Inhibitor [HC≡C—$C(CH_3)_2$—O—$Si(CH_3)_3$] | 0.07 g |
| Isopar G (manufactured by Esso Kagaku) | 55 g |

The thus obtained waterless blank plate of the present invention was irradiated from the silicone rubber layer side with a laser beam from a semiconductor-excited YAG laser so as to write a continuous line. The laser had a wavelength of 1064 nm and a beam diameter of 40 $\mu$m ($1/e^2$). Recording energy was 450 $mJ/cm^2$. Subsequently, the silicone rubber layer surface was rubbed with a development pad without use of a liquid to such a degree that the silicone rubber layer in non-image areas was not scratched, thereby removing most of the silicone rubber layer from areas exposed to the laser beam.

However, refuse of the silicone rubber layer removed from the exposed areas adhered to the non-image areas and/or image areas from which the silicone rubber layer had been removed. Further, part of the silicone rubber layer in the exposed areas remained.

Next, the silicone rubber layer surface was rubbed with a development pad which was soaked with an aqueous solution having the following composition.

<Composition of an aqueous solution>

| | |
|---|---|
| Tripropylene glycol n-butyl ether | 10 g |
| SXS-Y (sodium methaxylenesulfonate.$1H_2O$, manufactured by Mitsubishi Gas Chemical Company, Inc.) | 10 g |
| Water | 80 g |

As a result of the rubbing, refuse of the silicone rubber layer adhering to the plate surface and portions of the silicone rubber layer remaining in the exposed areas were completely removed, so that a silicone image having sharp edges was formed.

Also, a waterless blank plate was subjected to a writing process from the silicone rubber layer side through use of a semiconductor laser having an output of 110 mW, a wavelength of 830 nm, and a beam diameter of 10 $\mu$m ($1/e^2$). The main scanning rate was 5 m/sec. Subsequently, the plate was subjected to a developing process in a manner similar to the above. As a result, a waterless plate which bore a sharply edged image at a resolution of 8 $\mu$m was formed. Moreover, by repeating recording and developing processes in the same way apart from the fact that dots of 200 lpi were used at the time of recording through the laser beam, a silicone image having a dot percent ranging from 2% to 98% was formed on the plate. The thus-formed waterless plate was subjected to a printing process on a printing press. 20,000 copies were obtained which had excellent quality without smudges in non-image areas and dropout in image areas.

Example 2

A waterless blank plate prepared in Example 1 was subjected to a writing process under the same conditions as those of Example 1 through use of the semiconductor-excited YAG laser. Subsequently, the silicone rubber layer surface was rubbed with a development pad without use of a liquid to such a degree that the silicone rubber layer in non-image areas was not scratched, thereby removing most of the silicone rubber layer from areas exposed to the laser beam.

However, refuse of the silicone rubber layer removed from the exposed areas adhered to the non-image areas and/or image areas from which the silicone rubber layer had been removed. Further, part of the silicone rubber layer in the exposed areas remained.

Next, the silicone rubber layer surface was rubbed with a development pad which was soaked with tripropylene glycol. As a result, pieces of the silicone rubber layer adhering to the plate surface and portions of the silicone rubber layer remaining in the exposed areas were completely removed, so that a silicone image having sharp edges was formed.

Also, a waterless blank plate was subjected to a writing process through use of a semiconductor laser under the same conditions as those of Example 1 and was then subjected to a developing process in a manner similar to the above. As a result, a waterless plate which bore a sharply edged image at a resolution of 8 $\mu$m was formed. Moreover, by repeating recording and developing processes in the same way apart from the fact that dots of 200 lpi were used at the time of recording through the laser beam. As a result, a silicone image having a dot percent ranging from 2% to 98% was formed on the plate. The thus-formed waterless plate was subjected to a printing process on a printing press. 20,000 copies were obtained which had excellent quality without smudges in non-image areas and dropout in image areas.

Example 3

A waterless blank plate prepared in Example 1 was subjected to a writing process under the same conditions as those of Example 1 through use of the semiconductor-excited YAG laser. Subsequently, the silicone rubber layer surface was rubbed with a development pad without use of a liquid to such a degree that the silicone rubber layer in non-image areas was not scratched, thereby removing most of the silicone rubber layer from areas exposed to the laser beam.

However, refuse of the silicone rubber layer removed from the exposed areas adhered to the non-image areas and/or image areas from which the silicone rubber layer had been removed. Further, part of the silicone rubber layer in the exposed areas remained.

Next, the silicone rubber layer surface was rubbed with a development pad which was soaked with an aqueous solution in which DN-3C (a trade name of Fuji Photo Film Co., Ltd.) was diluted tenfold. As a result, pieces of the silicone rubber layer adhering to the plate surface and portions of the silicone rubber layer remaining in the exposed areas were completely removed, so that a silicone image having sharp edges was formed.

Also, a waterless blank plate was subjected to a writing process through use of a semiconductor laser under the same conditions as those of Example 1 and was then subjected to a developing process in a manner similar to the above. A waterless plate which bore a sharply edged image at a resolution of 8 $\mu$m was formed. Moreover, by repeating recording and developing processes in the same way apart from the fact that dots of 200 lpi were used at the time of recording through the laser beam. As a result, a silicone image having a dot percent ranging from 2% to 98% was formed on the plate. The thus-formed waterless plate was subjected to a printing process on a printing press. 20,000 copies were obtained which had excellent quality without smudges in non-image areas and dropout in image areas.

Comparative Example 1

A waterless blank plate prepared in Example 1 was subjected to a writing process under the same conditions as those of Example 1 through use of the semiconductor-excited YAG laser and the semiconductor laser. Subsequently, the silicone rubber layer surface was rubbed with a development pad soaked with the same aqueous solution as that used in Example 1 to such a degree that the silicone rubber layer in non-image areas was not scratched. Most of the silicone rubber layer in areas exposed to the laser beam remained, resulting in defective development. Thus, through use of the above development pad, the silicone rubber surface was further rubbed until the silicone rubber layer remaining in the exposed areas was completely removed. The surface of the silicone rubber layer in non-image areas was scratched. The thus-formed waterless plate was subjected to a printing process on a printing press, resulting in smudges on copies due to transfer of ink to scratches in the non-image areas.

Comparative Example 2

A waterless blank plate prepared in Example 1 was subjected to a writing process under the same conditions as those of Example 1 through use of the semiconductor-excited YAG laser and the semiconductor laser. Subsequently, the silicone rubber layer surface was rubbed with a development pad soaked with tripropylene glycol to such a degree that the silicone rubber layer in non-image areas was not scratched. Most of the silicone rubber layer in areas exposed to the laser beam remained, resulting in defective development. Thus, through use of the above development pad, the silicone rubber surface was further rubbed until the silicone rubber layer remaining in the exposed areas was completely removed. The surface of the silicone rubber layer in non-image areas was scratched. The thus-formed waterless plate was subjected to a printing process on a printing press, resulting in smudges on copies due to transfer of ink to scratches in the non-image areas.

Comparative Example 3

A waterless blank plate prepared in Example 1 was subjected to a writing process under the same conditions as those of Example 1 through use of the semiconductor-excited YAG laser and the semiconductor laser. Subsequently, the silicone rubber layer surface was rubbed with a development pad soaked with an aqueous solution in which DN-3C (a trade name of Fuji Photo Film Co., Ltd.) was diluted tenfold to such a degree that the silicone rubber layer in non-image areas was not scratched. Most of the silicone rubber layer in areas exposed to the laser beam remained, resulting in defective development. Thus, through use of the above development pad, the silicone rubber surface was further rubbed until the silicone rubber layer remaining in the exposed areas was completely removed. The surface of the silicone rubber layer in non-image areas was scratched. The thus-formed waterless plate was subjected to a printing process on a printing press, resulting in smudges on copies due to transfer of ink to scratches in the non-image areas.

Example 4

Support

A coating solution having the following composition was applied onto a polyethylene terephthalate support having a thickness of 100 μm, followed by drying for 1 minute at 100° C. such that the coating became 0.2 μm thick when dried, thereby forming a primer layer on the support.

<Composition of a coating solution for the primer layer>

| | |
|---|---|
| Chlorinated polyethylene | 1.0 g |
| $-(C_2H_{4-y}Cl_y)_n-$ y = 1.7, n = 200 | |
| Methyl ethyl ketone | 10 g |
| Cyclohexane | 100 g |

Formation of a Photothermal Conversion Layer

Ti was vapor-deposited on the above polyethylene terephthalate support coated with the chlorinated polyethylene under vacuum of $5\times10^{-5}$ Torr through application of resistance heat, thereby forming a photothermal conversion layer. The photothermal conversion layer had a thickness of 200 angstroms and an optical density of 0.6.

Formation of a Silicone Rubber Layer:

The following coating solution was applied onto the above photothermal conversion layer, followed by drying for 1 minute at 110° C., thereby forming a silicone rubber layer having a dry film thickness of 2 μm.

<Composition of a Coating Solution for the Silicone Rubber Layer>

| | |
|---|---|
| α,ω-dihydroxypolydimethylsiloxane (degree of polymerization approx. 900) | 9.00 g |
| Methyltriacetoxysilane | 1.00 g |
| Dimethyldiacetoxysilane | 1.00 g |
| Dibutyl tin octylate | 0.01 g |
| Isopar G (manufactured by Esso Kagaku) | 120 g |

Polyethylene terephthalate (cover film) was laminated onto the surface of the silicone rubber layer obtained as described above.

After the cover film was removed from the thus-obtained waterless blank plate, the blank plate was irradiated from the silicone rubber layer side with a laser beam from a semiconductor-excited YAG laser so as to write a continuous line. The laser had a wavelength of 1064 nm and a beam diameter of 40 μm ($1/e^2$). Recording energy was 450 $mJ/cm^2$. Subsequently, the silicone rubber layer surface was rubbed with a development pad without use of a liquid to such a degree that the silicone rubber layer in non-image areas was not scratched, thereby removing most of the silicone rubber layer from areas exposed to the laser beam.

However, refuse of the silicone rubber layer removed from the exposed areas adhered to the non-image areas and/or image areas from which the silicone rubber layer had been removed. Further, part of the silicone rubber layer in the exposed areas remained.

Next, the silicone rubber layer surface was rubbed with a development pad soaked with water. As a result, refuse of the silicone rubber layer adhering to the plate surface and portions of the silicone rubber layer remaining in the exposed areas were completely removed, so that a silicone image having sharp edges was formed.

Also, a waterless blank plate was subjected to a writing process from the silicone rubber layer side through use of a semiconductor laser having an output of 110 mW, a wavelength of 830 nm, and a beam diameter of 10 μm ($1/e^2$). The main scanning rate was 5 m/sec. Subsequently, the plate was subjected to a developing process in a manner similar to the above. A waterless plate which bore a sharply edged image at a resolution of 7 μm was formed. Moreover, by repeating recording and developing processes in the same way apart from the fact that dots of 200 lpi were used at the time of recording through the laser beam. A silicone image having a dot percent ranging from 2% to 98% was formed on the plate. The thus-formed waterless plate was subjected to a printing process on a printing press. 20,000 copies were obtained which had excellent quality without smudges in non-image areas and dropout in image areas.

Example 5

A waterless blank plate prepared in Example 4 was subjected to a writing process under the same conditions as those of Example 4 through use of the semiconductor-excited YAG laser. Subsequently, the silicone rubber layer surface was rubbed with a development pad without use of a liquid to such a degree that the silicone rubber layer in non-image areas was not scratched, thereby removing most of the silicone rubber layer from areas exposed to the laser beam.

However, refuse of the silicone rubber layer removed from the exposed areas adhered to the non-image areas and/or image areas from which the silicone rubber layer had been removed. Further, part of the silicone rubber layer in the exposed areas remained.

Next, the silicone rubber layer surface was rubbed with a development pad which was soaked with isopropyl alcohol. As a result, refuse of the silicone rubber layer adhering to the plate surface and portions of the silicone rubber layer remaining in the exposed areas were completely removed, so that a silicone image having sharp edges was formed.

Also, a waterless blank plate was subjected to a writing process through use of a semiconductor laser under the same conditions as those of Example 4 and was then subjected to a developing process in a manner similar to the above. As a result, a waterless plate which bore a sharply edged image at a resolution of 7 μm was formed. Moreover, by repeating recording and developing processes in the same way apart from the fact that dots of 200 lpi were used at the time of recording through the laser beam. A silicone image having a dot percent ranging from 2% to 98% was formed on the plate. The thus-formed waterless plate was subjected to a printing process on a printing press. 20,000 copies were obtained which had excellent quality without smudges in non-image areas and dropout in image areas.

Example 6

A waterless blank plate prepared in Example 4 was subjected to a writing process under the same conditions as those of Example 4 through use of the semiconductor-excited YAG laser. Subsequently, the silicone rubber layer surface was rubbed with a development pad without use of a liquid to such a degree that the silicone rubber layer in non-image areas was not scratched, thereby removing most of the silicone rubber layer from areas exposed to the laser beam.

However, refuse of the silicone rubber layer removed from the exposed areas adhered to the non-image areas and/or image areas from which the silicone rubber layer had been removed. Further, part of the silicone rubber layer in the exposed areas remained.

Next, the silicone rubber layer surface was rubbed with a development pad which was soaked with Isopar G (manufactured by Esso Kagaku). As a result, refuse of the silicone rubber layer adhering to the plate surface and portions of the silicone rubber layer remaining in the exposed areas were completely removed, so that a silicone image having sharp edges was formed.

Also, a waterless blank plate was subjected to a writing process through use of a semiconductor laser under the same conditions as those of Example 4 and was then subjected to a developing process in a manner similar to the above. As a result, a waterless plate which bore a sharply edged image at a resolution of 7 μm was formed. Under these recording and developing conditions, 200 lines of dots were formed. A silicone image having a dot percent ranging from 2% to 98% was formed on the plate. The thus-formed waterless plate was subjected to a printing process on a printing press. 20,000 copies were obtained which had excellent quality without smudges in non-image areas and dropout in image areas.

Comparative Example 4

A waterless blank plate prepared in Example 4 was subjected to a writing process under the same conditions as those of Example 4 through use of the semiconductor-excited YAG laser and the semiconductor laser. Subsequently, the silicone rubber layer surface was rubbed with a development pad soaked with water to such a degree that the silicone rubber layer in non-image areas was not scratched. Most of the silicone rubber layer in areas exposed to the laser beam remained, resulting in defective development. Thus, through use of the above development pad, the silicone rubber surface was further rubbed until the silicone rubber layer remaining in the exposed areas was completely removed. As a result, the surface of the silicone rubber layer in non-image areas was scratched. The thus-formed waterless plate was subjected to a printing process on a printing press, resulting in smudges on copies due to transfer of ink to scratches in the non-image areas.

Comparative Example 5

A waterless blank plate prepared in Example 4 was subjected to a writing process under the same conditions as those of Example 4 through use of the semiconductor-excited YAG laser and the semiconductor laser. Subsequently, the silicone rubber layer surface was rubbed with a development pad soaked with isopropyl alcohol to such a degree that the silicone rubber layer in non-image areas was not scratched. Most of the silicone rubber layer in areas exposed to a laser beam remained, resulting in defective development. Thus, through use of the above development pad, the silicone rubber surface was further rubbed until the silicone rubber layer remaining in the exposed areas was completely removed. As a result, the surface of the silicone rubber layer in non-image areas was scratched. The thus formed waterless plate was subjected to a printing process on a printing press, resulting in smudges on copies due to transfer of ink to scratches in the non-image areas.

Comparative Example 6

A waterless blank plate prepared in Example 4 was subjected to a writing process under the same conditions as those of Example 4 through use of the semiconductor-excited YAG laser and the semiconductor laser. Subsequently, the silicone rubber layer surface was rubbed with a development pad soaked with Isopar G (manufactured by Esso Kagaku) to such a degree that the silicone rubber layer in non-image areas was not scratched.

Most of the silicone rubber layer in areas exposed to a laser beam remained, resulting in defective development. Thus, through use of the above development pad, the silicone rubber surface was further rubbed until the silicone rubber layer remaining in the exposed areas was completely removed. As a result, the surface of the silicone rubber layer in non-image areas was scratched. The thus-formed waterless plate was subjected to a printing process on a printing press, resulting in smudges on copies due to transfer of ink to scratches in the non-image areas.

What is claimed is:

1. A method for forming a dampening-waterless lithographic plate comprising:

an irradiation step of irradiating a dampening-waterless lithographic blank plate imagewise with a laser beam, the dampening-waterless lithographic blank plate comprising a support, a photothermal conversion layer provided on the support, said photothermal conversion layer being a film containing at least one substance selected from the group consisting of titanium, titanium oxide, and titanium nitride, and an ink-repellent layer provided on the photothermal conversion layer wherein the laser beam passes through the ink-repellent layer and is converted to heat by the photothermal conversion layer;

a first rubbing step of rubbing the surface of the ink-repellent layer without use of a liquid so as to remove a portion of the ink-repellent layer in areas irradiated with a laser beam; and a second rubbing step of rubbing the surface of the dampening-waterless lithographic plate through use of a liquid so as to substantially completely remove pieces of the ink-repellant layer adhered onto the surface of the dampening-waterless lithographic plate and remaining portions of the ink-repellant layer, which have not been removed by the first rubbing step, in the areas which were irradiated with the laser beam.

2. A method for forming an image using a dampening-waterless lithographic plate according to claim 1, wherein the liquid used in the second rubbing step is a hydrocarbon, a polar solvent, water, or a mixture thereof.

3. A method for forming an image using a dampening-waterless lithographic plate according to claim 2, wherein the liquid used in the second rubbing step comprises a surfactant.

4. A method for forming an image using a dampening-waterless lithographic plate according to claim 1, wherein the liquid used in the second rubbing step is water or an aqueous solution of a water-soluble organic solvent.

5. A method for forming an image using a dampening-waterless lithographic plate according to claim 4, wherein the water-soluble organic solvent is selected from the group consisting of alcohols, ketones, and esters.

6. A method for forming an image using a dampening-waterless lithographic plate according to claim 1, wherein the liquid used in the second rubbing step is an aqueous solution of a water-soluble organic solvent which solution contains not less than 60% by weight of water.

7. A method for forming an image using a dampening-waterless lithographic plate according to claim 1, wherein a development pad and/or a brush are/is used in the first rubbing step and/or the second rubbing step.

8. A method for forming an image using a dampening-waterless lithographic plate according to claim 1, wherein the imagewise irradiating is carried out through said ink-repellent layer.

9. A method for forming an image using a dampening-waterless lithographic plate according to claim 1, wherein the adhesion of said ink-repellent layer to a layer thereunder is weakened by the imagewise irradiating.

10. The method of claim 1, wherein the ink-repellent layer comprises a silicone rubber which is formed by a composition that includes a crosslinking agent, dimethylpolysiloxane having a number average molecular weight of 3,000 to 100,000 and including at ends thereof functional groups that react with the crosslinking agent, and a catalyst.

11. The method of claim 10, wherein the thickness of the photothermal conversion layer is 50 to 1,000 Å.

12. The method of claim 1, wherein the thickness of the photothermal conversion layer is 50 to 1,000 Å.

* * * * *